United States Patent
Yeh et al.

(10) Patent No.: US 9,280,225 B2
(45) Date of Patent: Mar. 8, 2016

(54) ELECTRODE STRUCTURE FOR TOUCHSCREEN

(71) Applicant: J TOUCH CORPORATION, Taoyuan County (TW)

(72) Inventors: Yu-Chou Yeh, Taoyuan County (TW); Tsung-Her Yeh, New Taipei (TW); Szu-Kai Liao, Taoyuan County (TW); Chiu-Cheng Tsui, Taoyuan County (TW)

(73) Assignee: J TOUCH CORPORATION, Taoyuan County (TW)

( * ) Notice: Subject to any disclaimer, the term of this patent is extended or adjusted under 35 U.S.C. 154(b) by 227 days.

(21) Appl. No.: 14/040,836

(22) Filed: Sep. 30, 2013

(65) Prior Publication Data
US 2015/0092119 A1    Apr. 2, 2015

(51) Int. Cl.
G06F 3/041    (2006.01)
H05K 3/38    (2006.01)
H05K 1/02    (2006.01)
H05K 1/03    (2006.01)

(52) U.S. Cl.
CPC ............. *G06F 3/041* (2013.01); *H05K 3/386* (2013.01); *H05K 3/388* (2013.01); *H05K 1/0274* (2013.01); *H05K 1/0393* (2013.01); *H05K 2201/0329* (2013.01); *H05K 2201/0338* (2013.01)

(58) Field of Classification Search
CPC ....... G06F 3/0488; G06F 3/041; H05K 3/388; H05K 3/386; H05K 2201/0329; H05K 1/0274; H05K 1/0393
USPC .............. 345/173–184; 178/18.01–20.04
See application file for complete search history.

(56) References Cited

U.S. PATENT DOCUMENTS

| | | | |
|---|---|---|---|
| 2007/0031650 A1* | 2/2007 | Kobayashi | B32B 7/06 428/323 |
| 2011/0148823 A1* | 6/2011 | Chen | G06F 3/044 345/176 |
| 2011/0157038 A1* | 6/2011 | Feng | G06F 3/041 345/173 |
| 2012/0306812 A1* | 12/2012 | Lai | G06F 3/0412 345/174 |
| 2012/0327023 A1* | 12/2012 | Hashimoto | G06F 3/041 345/174 |
| 2013/0002572 A1* | 1/2013 | Jin | G02F 1/133305 345/173 |
| 2013/0194519 A1* | 8/2013 | Ivanov | G02F 1/13338 349/12 |
| 2013/0241862 A1* | 9/2013 | Kim | C09J 7/0246 345/173 |

(Continued)

FOREIGN PATENT DOCUMENTS

KR    1020000048333    7/2000
KR    1020080066658    7/2008

*Primary Examiner* — Kumar Patel
*Assistant Examiner* — Vinh Lam
(74) *Attorney, Agent, or Firm* — Li & Cai Intellectual Property (USA) Office

(57) ABSTRACT

An electrode structure for a touchscreen is provided. The electrode structure includes a flexible substrate and a plurality of electrode lines, wherein the electrode line includes a first adhesive layer, a second adhesive layer, a conductive layer, a first resist layer and a second resist layer. Through the configuration above, the electrode structure of the present application adheres the flexible substrate strongly by the first adhesive layer, and the second adhesive layer strengthen the adhesion between the first adhesive layer and the conductive layer, so that the conductive layer may be firmly adhered to the flexible substrate, even change the shape of the substrate, the electrode lines are not easy to fall off. The present invention also provides an electrode structure for scattering the reflective metallic luster to make observer imperceptible and reduce the backlight interference.

20 Claims, 3 Drawing Sheets

(56) References Cited

U.S. PATENT DOCUMENTS

| | | | |
|---|---|---|---|
| 2014/0078417 A1* | 3/2014 | Lee | G06F 3/0412 349/12 |
| 2014/0125603 A1* | 5/2014 | Lin | H01L 31/02168 345/173 |
| 2014/0145999 A1* | 5/2014 | Den Boer | G06F 3/044 345/174 |
| 2014/0168138 A1* | 6/2014 | Kuo | G06F 3/0412 345/174 |
| 2014/0176453 A1* | 6/2014 | Lee | G06F 3/041 345/173 |
| 2014/0176481 A1* | 6/2014 | Zhang | G06F 3/044 345/174 |
| 2014/0198060 A1* | 7/2014 | Wu | G06F 3/0412 345/173 |
| 2014/0293150 A1* | 10/2014 | Tang | G06F 3/044 349/12 |
| 2014/0300831 A1* | 10/2014 | Yang | G06F 3/044 349/12 |
| 2014/0312339 A1* | 10/2014 | Fujita | H01L 27/322 257/40 |
| 2014/0362027 A1* | 12/2014 | Hsu | G06F 3/044 345/174 |

* cited by examiner

ELECTRODE STRUCTURE FOR TOUCHSCREEN

BACKGROUND OF THE INVENTION

1. Field of the Invention

The instant disclosure relates to an electrode structure for touchscreen; in particular, to an electrode structure for a flexible touch panel.

2. Description of Related Art

Conventional touch panel generally use indium tin oxide (ITO) to form the electrodes to make the electrodes imperceptible. However, with the gradual development to the large-size touch panel, some defects of ITO electrodes are emerged such as high resistance, slow response and etc. Therefore, the industry has been trying to use thin metal wires to form the electrodes.

In general, the touch panel using metal conductor as the electrodes often occurs the electrodes peeling due to the bad adhesion between the metal conductor and the common substrate, thereby affecting the performance of the touch panel. If applied to the flexible touch panel, it will exacerbate the occurrence of electrode peeling because the substrate is frequently deformed by the change of the environmental conditions.

In addition, the metal conductor is liable to produce metallic luster and be observed easily by the human eyes. Therefore, it is the goal of this industry must strive to develop a steady and invisible electrode structure for a flexible touch panel in conjunction with the imperceptibleness at the same time.

SUMMARY OF THE INVENTION

The object of the instant disclosure is to provide an electrode structure for touchscreen which can be attached to flexible substrate firmly and reduce metallic luster at the same time.

The instant disclosure is to provide an electrode structure for touchscreen comprising a flexible substrate and a plurality of electrode lines set on the flexible substrate, wherein the electrode lines includes a first adhesive layer set on the flexible substrate, a second adhesive layer set on the first adhesive layer, a conductive layer set on the second adhesive layer and a first resist layer set on the conductive layer.

According to an embodiment of the instant disclosure, the electrode lines may further comprise a second resist layer which at least cover side of the conductive layer and also can cover the first resist layer, the conductive layer, the second adhesive layer and the first adhesive layer on the flexible substrate entirely. The second resist layer can reflect the light to different angles to make human eye not come into contact with reflected light, thereby achieve the antireflection effect.

In the instant disclosure, the first adhesive layer is used to enhance the adhesion to the flexible substrate, and the second adhesive layer is used to enhance the adhesion between the conductive layer and the first adhesive layer.

By the above configuration, the instant disclosure can produce a strong adhesion to the flexible substrate through the first adhesive layer, along with the enhance to the adhesion between the conductive layer and the first adhesive layer through the second adhesive layer, thereby the conductive layer can be firmly adhered to the flexible substrate even if the substrate shape changes, the electrodes are not easy to fall off. Furthermore, by controlling the etching rate of each layer to produce the electrode structure with a cascading surface, it can further scatter the light to reducing the visibility.

In order to further understand the instant disclosure, the following embodiments and illustrations are provided. However, the detailed description and drawings are merely illustrative of the disclosure, rather than limiting the scope being defined by the appended claims and equivalents thereof.

DETAILED DESCRIPTION OF THE PREFERRED EMBODIMENTS

An electrode structure of the instant disclosure will be explained below through the embodiments. It has to be mentioned, the embodiments of the present invention are not intended to limit the present invention implementing in any specific environment, applications, or particular manner as described below. Therefore, the description of the embodiments only explains the purpose of the invention, not to limit the present invention.

Figure 1:
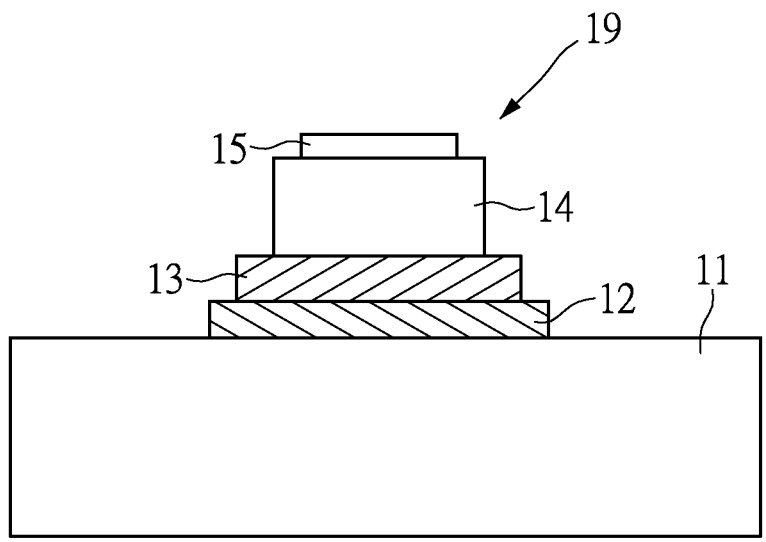
FIG. 1 is a sectional drawing of an electrode structure in accordance with first embodiment of the instant disclosure.

Please refer to FIG. 1 as a sectional drawing of an electrode structure in accordance with first embodiment of the instant disclosure. In this embodiment, the electrode structure of the instant disclosure comprises a flexible substrate 11 and a plurality of electrode lines 19 (only one line illustrated in FIG. 1), and in practice, the electrode lines 19 can be set on the flexible substrate 11 in parallel. Wherein the electrode lines 19 includes a first adhesive layer 12 set on the flexible substrate 11, a second adhesive layer 13 set on the first adhesive layer 12, a conductive layer 14 set on the second adhesive layer 13 and a first resist layer 15 set on the conductive layer 14.

In detail, the first adhesive layer 12 covers on the flexible substrate 11 to improve the adhesion to the flexible substrate 11 and with the effect of anti-reflective, anti-interference, anti-rainbow pattern, anti-abrasion, anti-scratch and enhance the comfort to human eyes. The second adhesive layer 13 covers on the first adhesive layer 12 to improve the adhesion between the conductive layer 14 and the first adhesive layer 12 and maintains the total conductivity of the electrode lines 19. The conductive layer 14 covers on the second adhesive layer 13 to keep conduct. The first resist layer 15 which has better corrosion resistance than the conductive layer 14 covers on the conductive layer 14 to prevent the conductive layer 14 from lateral etching severely thereby the electrode lines 19 can retain a normal width.

As a whole, the first adhesive layer 12 can form a strong adhesion with the flexible substrate 11 along with enhance of the adhesion between the conductive layer 14 and the first adhesive layer 12 by the second adhesive layer 13. By this double-layer structure, the conductive layer 14 can be firmly adhered to the flexible substrate 11 with not easy falling off and have the effect of anti-reflective, anti-interference, anti-rainbow pattern, anti-abrasion, anti-scratch and improve the comfort to human eyes. The first resist layer 15 can postpone the oxidation or corrosion to the metal electrode.

To achieve the above effect, the material to form the flexible substrate 11 may comprise one of the groups consisting of Polyethylene terephthalate (PET), Polyethylenimine (PEI), Polyphenylene sulfone (PPSU), Polyimide (PI) and its complex.

Furthermore, the material to form the first adhesive layer 12 may comprise one of the groups consisting of polymer, oxide, metal and its complex, in detail, the polymer is used for improving the adhesion between the first adhesive layer 12 and the flexible substrate 11; the oxide is used for the anti-reflective, anti-interference, anti-rainbow pattern, anti-abrasion and anti-scratch; the metal is used for improving the adhesion between the first adhesive layer 12 and the second adhesive layer 13. The polymer may comprise one of the groups consisting of acrylic, Polyethylene terephthalate (PET), Polyethylenimine (PEI), Polyphenylene sulfone (PPSU), Polyimide (PI), poly(3,4-ethylenedioxythiophene) (PEDOT), polyaniline, polypyrrole and its complex; the oxide could be amorphous or polycrystalline oxide film or powder which may comprise one of the groups consisting of titanium oxide, tantalum oxide, silicon oxide, aluminum oxide and its complex; the metal may comprise copper, silver, aluminum, molybdenum, nickel, chromium, tungsten, titanium, silicon, tin, zinc, iron and its alloys. It should be emphasized, the above polymer, oxide and metal all can use individually or be mixed in two/three material to form complex, for example: a complex with polymer and oxide, a complex with polymer and metal, a complex with oxide and metal, a complex with polymer, oxide and metal. If the complex is used, the ratio range of polymer is between 10-90%, of oxide is between 10-90% and of metal is between 10-90%. The oxide also could be a poly-layer complex, in an embodiment, titanium oxide with 900 nm in thickness and silicon oxide with 100 nm in thickness can be chosen. Additionally, as a whole, the thickness of the first adhesive layer 12 is preferred to between 0.001 µm and 1 µm; the reflectivity of the first adhesive layer 12 is between 1% and 50% and is preferred under 30%.

In the instant disclosure, the material to form the second adhesive layer 13 may comprise one of the groups consisting of copper, silver, molybdenum, nickel, chromium, tungsten, titanium, tin, zinc, aluminum, iron and its alloys, and the thickness of the second adhesive layer 13 is preferred between 0.001 µm and 1 µm. The reflectivity of the second adhesive layer 13 is between 1% and 50% and is preferred under 30%. Additionally, as a whole, the total reflectivity of the first adhesive layer 12 and the second adhesive layer 13 is preferred under 30%.

In the instant disclosure, the material to form the conductive layer 14 may comprise one of the groups consisting of copper, gold, silver, aluminum, tungsten, iron, nickel, chromium, titanium, molybdenum, tin, zinc and its alloys, and the thickness of the conductive layer 14 is preferred between 0.001 µm and 5 µm.

To achieve the optimizing of adhesion and conductivity, if the conductive layer 14 is formed with pure metal, the material of the second adhesive layer 13 contains the pure metal over than 50% and the material of the first adhesive layer 12 contains the pure metal less than 50%. In an embodiment, the conductive layer 14 could be straight copper wires, the first adhesive layer 12 could be a nickel-copper-chromium-iron alloy with the composition ratio of 60:30:10:0 or 80:10:5:5 or a nickel-tungsten alloy with the composition ratio of 50:50, and the first adhesive layer 12 also could contain other trace elements such as silicon, phosphorous and etc; the second adhesive layer 13 could be a copper-nickel-chromium alloy with the composition ratio of 60:30:10 or a copper-nickel-tungsten alloy with the composition ratio of 60:20:20, and the second adhesive layer 13 also could contain other trace elements such as silicon, phosphorous and etc.

In the instant disclosure, the material to form the first resist layer 15 may comprise one of the groups consisting of copper, silver, aluminum, molybdenum, nickel, chromium, tungsten, titanium, silicon, tin, zinc, iron, and its alloys, and the thickness of the first resist layer 15 is preferred between 0.001 µm and 1 µm in an embodiment. The reflectivity of the first resist layer 15 is between 1% and 50% and is preferred under 30%.

During the process to manufacturing the electrode structure of the instant disclosure, a cascading surface (as shown in FIG. 1) can be formed with the first adhesive layer 12, the second adhesive layer 13, the conductive layer 14 and the first resist layer 15 on the flexible substrate 11 through controlling the etching proportion of the individual layer, and the cascading surface is an irregular surface so when the light reflected from the electrode, the reflective light will be scattered to different angles to make the electrode structure imperceptible for human eyes.

Figure 2:
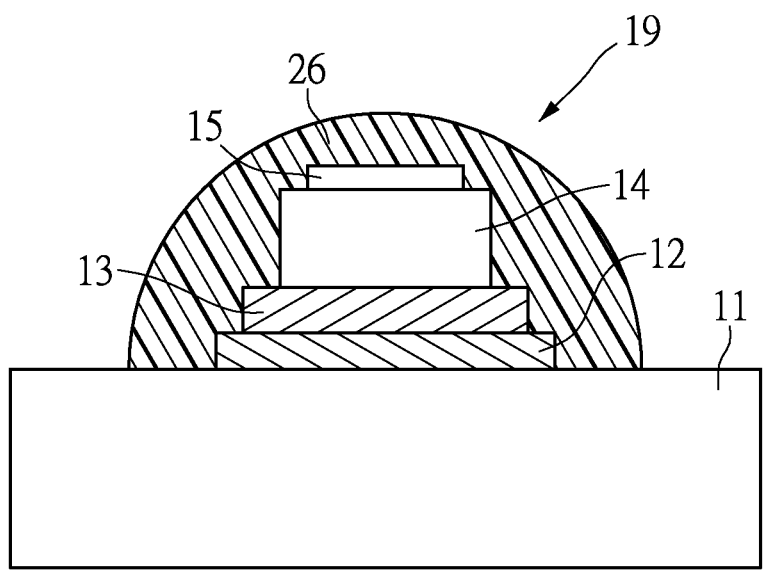
FIG. 2 is a sectional drawing of an electrode structure in accordance with second embodiment of the instant disclosure.

FIG. 2 is a sectional drawing of an electrode structure in accordance with second embodiment of the instant disclosure. In the instant disclosure, the electrode lines 19 may further comprise a second resist layer 26 set on the first resist layer 15 and at least cover the side of the conductive layer 14, if need be, the electrode lines 19 can entirely cover the first resist layer 15, the conductive layer 14, the second adhesive layer 13 and the first adhesive layer 12 on the flexible substrate 11. The second resist layer 26 covers the first resist layer 15 to improve the corrosion resistance of the conductive layer 14, to reduce the chance of foreign body rubbing metal electrodes to damage and lower the front and side reflective of metal electrodes.

In the instant disclosure, the material to form the second resist layer 26 may comprise one of the groups consisting of oxide, polymer, carbon and its complex. The oxide may comprise silicon oxide, titanium oxide, aluminum oxide and its complex; the polymer may comprise PEDOT, polyaniline, polypyrrole and its complex. If the complex is utilized, the ratio of the polymer is 10-90% and the oxide is 10-90%. Additionally, as a whole, the thickness of the second resist layer 26 is preferred between 0.001 µm and 1 µm. The reflectivity of the second resist layer 26 is between 1%-50% and is preferred under 30%. Additionally, as a whole, the total reflectivity of the first resist layer 15 and the second resist layer 26 is preferred under 30%.

Figure 3:
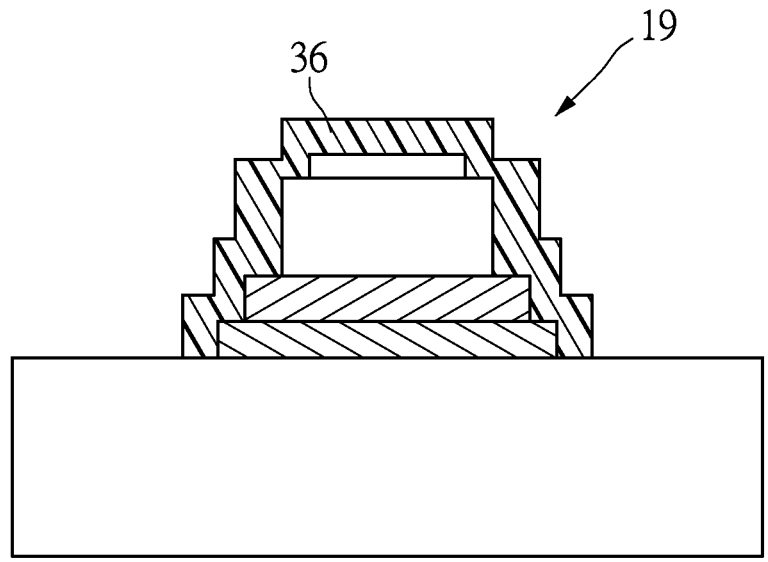
FIG. 3 is a sectional drawing of an electrode structure in accordance with third embodiment of the instant disclosure.
Figure 4:
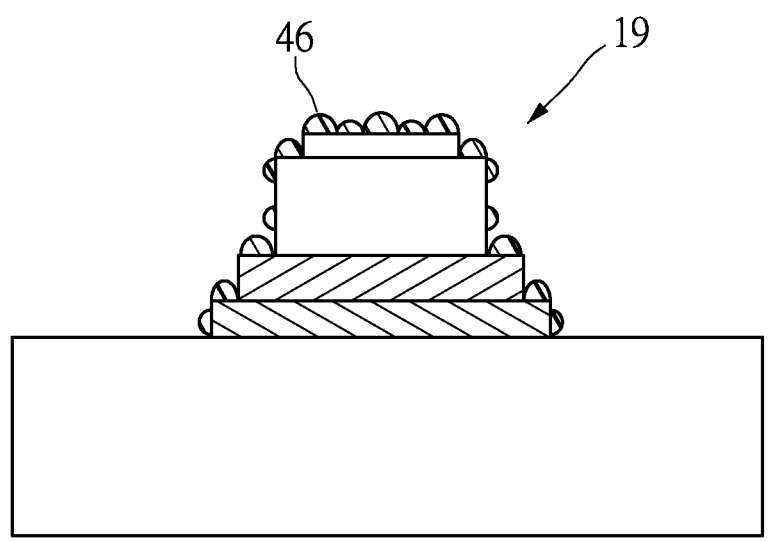
FIG. 4 is a sectional drawing of an electrode structure in accordance with fourth embodiment of the instant disclosure.
Figure 5:
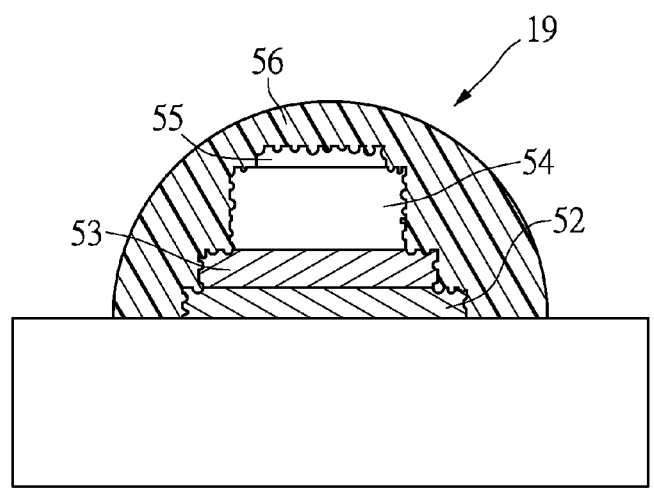
FIG. 5 is a sectional drawing of an electrode structure in accordance with fifth embodiment of the instant disclosure.

FIG. 3 is a sectional drawing of an electrode structure in accordance with third embodiment of the instant disclosure. FIG. 4 is a sectional drawing of an electrode structure in accordance with fourth embodiment of the instant disclosure. The different between FIG. 3, FIG. 4 and FIG. 2 is that the second resist layer 36 is a thin layer with a cascading surface in FIG. 3; the second resist layer 46 includes a granular surface and the diameter of the granule thereon is less than 900 nm and is preferred between 300 nm and 800 nm in FIG. 4; the second resist layer 26 is a thin layer with curved surface in FIG. 2. In addition to the second resist layer 26, 36, 46 prevent corrosion of the electrodes, but also have the effect to reduce reflective of metal electrodes. FIG. 5 is a sectional drawing of an electrode structure in accordance with fifth embodiment of the instant disclosure. Compared to FIG. 5 and FIG. 2, the second resist layer 26, 56 both include curved thin layer in electrode structure but the different to FIG. 5 and FIG. 2 is that the first adhesive layer 52, the second adhesive layer 53, the conductive layer 54, the first resist layer 55 all have irregular and rough surfaces, so that the reflective effect of metal electrodes can further be reduced.

It should be mentioned that the materials and the preferred thickness described in the above components are only to detail the effect of each component and the achievement to reach, not to limit the instant disclosure, as long as the same effect can be achieved, the materials and thickness are not be limited here.

Figure 6:
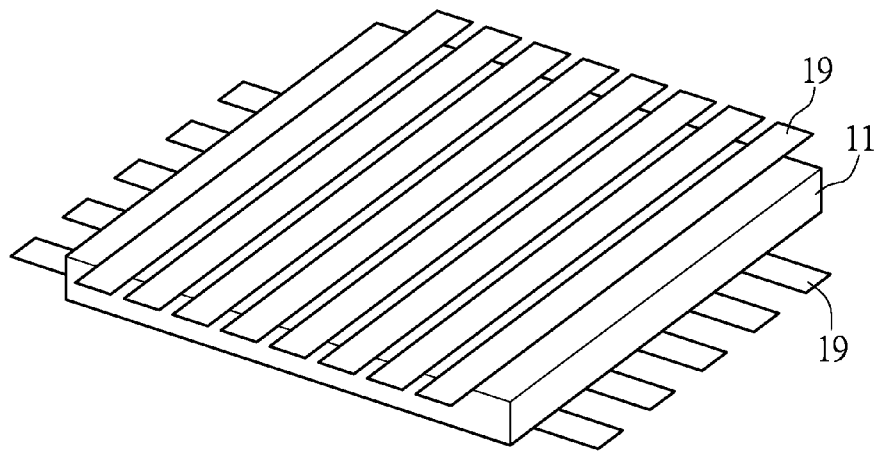
FIG. 6 is a schematic diagram illustrating the electrode structure of the instant disclosure being applied on a touch panel.

Next refer to FIG. 6, is a schematic diagram illustrating the electrode structure of the instant disclosure being applied on a touch panel. The general situation in practical application to the flexible substrate 11 and the plurality of electrode lines 19 as shown in the drawing, the electrode lines 19 on the two surfaces of the flexible substrate 11 are insulated overlapping to each other, and the capacitor value is detecting when the electrode lines 19 is conduction. It should be emphasized, the electrode lines 19 protrude over the flexible substrate 11 as shown in FIG. 6 is for convenience descriptions and are not actual situation.

In summary, the instant disclosure provides a electrode structure for touchscreen which produces a strong adhesion to the flexible substrate 11 through the first adhesive layer 12, along with the enhance to the adhesion between the first adhesive layer 12 and the conductive layer 14 through the second adhesive layer 13, thereby the electrode lines 19 can be firmly adhered to the flexible substrate 11. Furthermore, the first resist layer 15 postpones the oxidation or corrosion to the conductive layer 14, the second resist layer 26, 36, 46, 56 at least cover the side of the conductive layer 14, this two protection mechanisms can effectively prevent the electrode contacts form oxidation or corrosion and prolong the durability. by controlling the etching rate of each layer to produce the electrode structure with a cascading surface, it can further scatter the light to reducing the visibility. Due to a cascading surface included in the electrode structure of the instant disclosure, the reflective of the metal electrodes will be reduced, superadded forming the second adhesive layer 13 and the second resist layer 26, 36, 46, 56 further having the effect of anti-reflective, anti-interference, anti-rainbow pattern, to reach vision comfortable.

The figures and descriptions supra set forth illustrated the preferred embodiments of the instant disclosure; however, the characteristics of the instant disclosure are by no means restricted thereto. All changes, alternations, combinations or modifications conveniently considered by those skilled in the art are deemed to be encompassed within the scope of the instant disclosure delineated by the following claims.

What is claimed is:

1. An electrode structure for a touchscreen comprising:
A flexible substrate; and
A plurality of electrode lines provided on the flexible substrate, wherein at least one of the electrode lines comprises:
   a first adhesive layer provided on the flexible substrate;
   a second adhesive layer provided on the first adhesive layer;
   a conductive layer provided on the second adhesive layer; and
   a first resist layer provided on the conductive layer;
   wherein the first adhesive layer, the second adhesive layer, the conductive layer and the first resist layer are formed a cascading surface on the flexible substrate;
   wherein the total reflectivity of the first adhesive layer and the second adhesive layer is under 30%.

2. The electrode structure as recited in claim 1, wherein at least one of the electrode lines further comprises a second resist layer, and the second resist layer at least covers side of the conductive layer.

3. The electrode structure as recited in claim 2, wherein the second resist layer is a thin layer with a cascading surface.

4. The electrode structure as recited in claim 2, wherein the second resist layer comprises a granular surface and the diameter of the granule thereon is between 300 nm and 800 nm.

5. The electrode structure as recited in claim 2, wherein the second resist layer is a thin layer with a curved surface.

6. The electrode structure as recited in claim 1, wherein the first adhesive layer, the second adhesive layer, the conductive layer and the first resist layer comprise an irregular surface.

7. The electrode structure as recited in claim 1, wherein the material to form the flexible substrate comprises one of the groups consisting of Polyethylene terephthalate (PET), Polyethylenimine (PEI), Polyphenylene sulfone (PPSU), Polyimide (PI) and its complex.

8. The electrode structure as recited in claim 1, wherein the material to form the first adhesive layer comprises one of the groups consisting of polymer, oxide, metal, and its complex.

9. The electrode structure as recited in claim 8, wherein the polymer comprises one of the groups consisting of acrylic, Polyethylene terephthalate (PET), Polyethylenimine (PEI), Polyphenylene sulfone (PPSU), Polyimide (PI), Poly(3,4-ethylenedioxythiophene) (PEDOT), polyaniline, polypyrrole and its complex.

10. The electrode structure as recited in claim 8, wherein the oxide comprises one of the groups consisting of titanium oxide, tantalum oxide, silicon oxide, aluminum oxide and its complex.

11. The electrode structure as recited in claim 8, wherein the metal comprises one of the groups consisting of copper, silver, aluminum, molybdenum, nickel, chromium, tungsten, titanium, silicon, tin, zinc, iron and its alloys.

12. The electrode structure as recited in claim 1, wherein the material to form the second adhesive layer comprises one of the groups consisting of copper, silver, molybdenum, nickel, chromium, tungsten, titanium, tin, zinc, aluminum, iron and its alloys.

13. The electrode structure as recited in claim 1, wherein the material to form the conductive layer comprises one of the groups consisting of copper, gold, silver, aluminum, tungsten, iron, nickel, chromium, titanium, molybdenum, tin, zinc and its alloys.

14. The electrode structure as recited in claim 1, wherein the material to form the first resist layer comprises one of the groups consisting of copper, silver, aluminum, molybdenum, nickel, chromium, tungsten, titanium, silicon, tin, zinc, iron and its alloys.

15. The electrode structure as recited in claim 2, wherein the material to form the second resist layer comprises one of the groups consisting of oxide, polymer, carbon and its complex.

16. The electrode structure as recited in claim 15, wherein the oxide comprises one of the groups consisting of silicon oxide, titanium oxide, aluminum oxide and its complex.

17. The electrode structure as recited in claim 15, wherein the polymer comprises one of the groups consisting of Poly (3,4-ethylenedioxythiophene) (PEDOT), polyaniline, polypyrrole and its complex.

18. The electrode structure as recited in claim 2, wherein the thickness of the first adhesive layer is between 0.001 μm and 1 μm, the thickness of the second adhesive layer is between 0.001 μm and 1 μm, the thickness of the conductive layer is between 0.001 μm and 5 μm, the thickness of the first resist layer is between 0.001 μm and 1 μm, and the thickness of the second resist layer is between 0.001 μm and 1 μm.

19. The electrode structure as recited in claim 2, wherein the reflectivity of the first adhesive layer is between 1% and 50%, the reflectivity of the second adhesive layer is between 1% and 50%, the reflectivity of the first resist layer is between 1% and 50%, the reflectivity of the second resist layer is between 1% and 50%, and the total reflectivity of the first resist layer and the second resist layer is under 30%.

20. The electrode structure as recited in claim 1, wherein the conductive layer is a pure metal, and the material to form the second adhesive layer comprises a ratio to the pure metal over than 50% and the material to form the first adhesive layer comprises a ratio to the pure metal less than 50%.

* * * * *